United States Patent [19]

Bartley et al.

[11] Patent Number: 5,745,987
[45] Date of Patent: May 5, 1998

[54] METHOD FOR BONDING CIRCUIT BOARDS TO PALLETS

[75] Inventors: Paul L. Bartley, West Newbury, Mass.; Deborah A. Fisher, Columbus, Ohio

[73] Assignee: Lucent Technologies Inc., Murray Hill, N.J.

[21] Appl. No.: 546,424

[22] Filed: Oct. 20, 1995

[51] Int. Cl.⁶ ................................................. H05K 3/34
[52] U.S. Cl. .......................... 29/840; 29/830; 156/295
[58] Field of Search ............................ 29/830, 840, 846, 29/832; 174/254, 264; 156/295

[56] References Cited

U.S. PATENT DOCUMENTS

| | | | |
|---|---|---|---|
| 4,685,210 | 8/1987 | King et al. | 29/830 |
| 5,283,947 | 2/1994 | Santo et al. | 29/840 |
| 5,401,913 | 3/1995 | Gerber et al. | |
| 5,601,678 | 2/1997 | Gerber et al. | 156/295 X |

OTHER PUBLICATIONS

Machinery's Handbook 23rd Edition by Erik Oberg, Franklin D. Jones and Holbrook L. Horton p. 1204, 1988.

*Primary Examiner*—Carl J. Arbes

[57] ABSTRACT

A method of joining a metal heat sink pallet to a circuit board by electroplating a layer of solder on the mounting surface of the pallet, placing and holding the circuit board metal circuit paths firmly against the plated mounting surface of the pallet and heating the pallet until the solder melts and alloys with the circuit paths. A nitrogen gas bath is used to inhibit oxidation during heating and alloying and a flux is used to promote alloying. A bonding fixture accurately positions the circuit board with respect to the pallet and applies pressure in circuit path areas of interest during heating, alloying and cooling to accurately position the circuit board on the pallet and to promote a superior mechanical and electrical bond between the circuit paths and the pallet.

8 Claims, 4 Drawing Sheets

METHOD FOR BONDING CIRCUIT BOARDS TO PALLETS

FIELD OF THE INVENTION

The present invention relates to a novel method for connecting a printed electronic circuit board to a heat sink. More particularly, this invention relates to a novel method for bonding an RF amplifier circuit board to a metal substrate.

BACKGROUND OF THE INVENTION

Problem

Printed electronic circuit boards are constructed of one or more layers of electrically insulating material. In RF (radio frequency) applications, the insulating material is conventionally a teflon glass or silicon non-conductive sheet. Each sheet is typically penetrated by vias and has electroconductive circuit paths applied to the sheet face, often connecting and including the vias. The electroconductive circuit paths are conventionally silk-screened on the non-conductive sheets and are typically of copper composition. The vias penetrating the non-conductive sheets provide a pathway whereby copper, solder or other conductive materials can penetrate from one electroconductive circuitry layer to another. The various layers are stacked one on top of another. To construct multi-layered boards, the two innermost sheets are float soldered to one another, the next outer sheets are then float soldered to the previously soldered pair and so forth to create a multi-layered board. The board is then populated with components on its upper surface appropriate to the function and purpose of the circuit board. Mounting of components may be by either surface mount adhesives or soldering, both techniques well known in the art.

Certain circuit boards, notably those including an amplifier circuit, create heat during operation which must be dissipated in some manner to avoid degradation of the circuitry and, potentially, component failure. In an RF amplifier, the RF circuit board has certain zones commonly known as DC traces which must be electrically isolated from the metal heat sink pallet, while other components and circuitry paths require both an electrical and a mechanical bond with and the metal heat sink pallet. Typically the pallet is constructed of aluminum or copper.

Several conventional solutions exist for bonding, electrically and mechanically, the circuit board sheets to the metal heat sink pallet—mechanical connection, adhesive connection and solder connection.

Mechanical connection can be achieved by drilling mating holes in the circuit board and the pallet. Screws are inserted and screwed down to lock the circuit board to the pallet. While an acceptable mechanical connection may result, the screws occupy areas of the circuit board which could otherwise be used to route circuit paths or install components.

Adhesive connection can be achieved by applying an electrically conductive adhesive, such as a silver-filled conductive epoxy, on the mating surface of the pallet and pressing the circuit board in place. The adhesive technique suffers from several shortcomings. Since pressure must be applied to set the board in the adhesive against the pallet, there will be some flow of the adhesive which can result in an undesired electrical connection in one area of the board and/or the flow of the adhesive into vias which affects subsequent population of the circuit board. Moreover, an adhesive connection can loosen over time from thermal stress as the circuit board cycles through heating and cooling transitions during use. Also, the adhesive remains soft, allowing the circuit board to shift position with respect to the pallet.

Conventional solder connection uses "solder buttering" of the pallet which requires that the pallet be heated on a hot plate and maintained at a temperature sufficiently high to keep solder applied to its mating surface in a liquid state. The pallet is coated with solder flux to prepare the surface and the solder is "buttered" on the surface using a soldering iron, spreading the solder until the entire surface is coated. The pallet is assembled to the circuit board by placing the circuit board on the pallet and reheating the pallet until the solder melts and alloys to the circuit paths of the circuit board. With the techniques currently known in the art, this process is far from clean, which this description might otherwise imply. Because of the method of application of the solder to the pallet, there is often excess solder which will flow from between the circuit board and pallet which must be disposed of. Likewise, because the solder coating is uneven, additional solder must often be added along the circuit board and pallet interface edges so that it can wick between the pallet and board where insufficient solder was applied in the initial buttering. Additional difficulties arise at the time the assembly is populated. If the circuit board is populated with electronic components which are to be soldered in place, in commercial manufacture this is accomplished in a reflow oven which melts the solder paste applied to the board surface permitting it to flow into the vias to hold the pieces. Detrimentally, the reflow oven likewise heats the solder between the pallet and the circuit board which can result in the solder connection being weakened; in the solder flowing into areas where it is not desired; and in the pallet and circuit board shifting position with respect to one another.

There is therefore a need in the art for a method of attaching circuit boards to pallets which is easily accomplished, can be easily incorporated into a board manufacturing process, that provides an accurate, reliable, long term bond between the pallet and the circuit paths of the circuit board, and which is unaffected by subsequent solder reflow operations on the assembly.

Solution

The above problems are solved and an advance is made over the prior art in accordance with our invention wherein a novel approach is taken to provide a connection between circuit boards, notably RF boards, and pallets.

In accordance with one aspect of the invention, the pallet is electroplated with the bonding metal to provide an even layer of bonding consituent.

In accordance with another aspect of the invention, the bonding metal is a tin/lead solder having a higher melting point than the solder used in subsequent assembly operations, notably in populating the board with components.

In accordance with still another aspect of the invention, the pallet is machined prior to plating to remove sections of the pallet which are not to contact the circuit board;

In accordance with yet another aspect of the invention, the mating surfaces of the circuit board and the pallet are accurately positioned with respect to one another thru use of a fixture.

In accordance with yet still another aspect of the invention, the circuit board and pallet are pressed against one another are held in close contact throughout the solder bonding.

In accordance with a still further aspect of the invention, a fixture applies pressure against the circuit board at locations where good adhesion between the circuit board and the pallet are of particular interest.

DETAILED DESCRIPTION

According to the instant invention, reliable bonding and uniform adhesion between a circuit board and a pallet are achieved while avoiding the problems inherent in the prior art processes. This is accomplished, in our inventive process, by coating the pallet with a uniform layer of metal which has a melting point higher than that of the metals to be used in subsequent operations on the circuit board and pallet assembly; and causing bonding between the circuit board and the pallet to occur while there is a strong mechanical connection between them by pressing the two together during alloying of the pallet coating to the circuit board coating. Further discussion will focus on a common two-layer RF circuit board bonded to an aluminum pallet, although the technique is easily applied to other boards and pallets.

Figure 1:
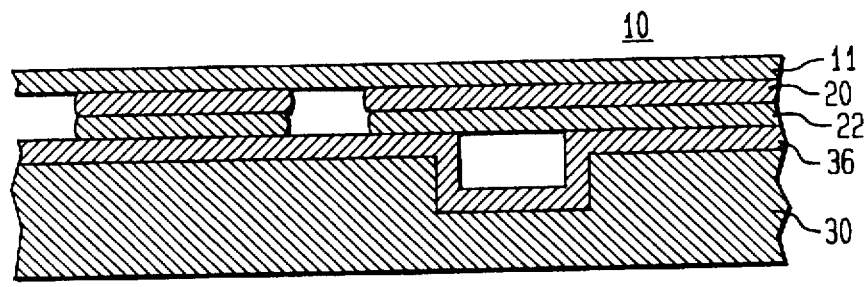
FIG. 1 is a cross section of an RF circuit board constructed using the instant invention.
Figure 2:
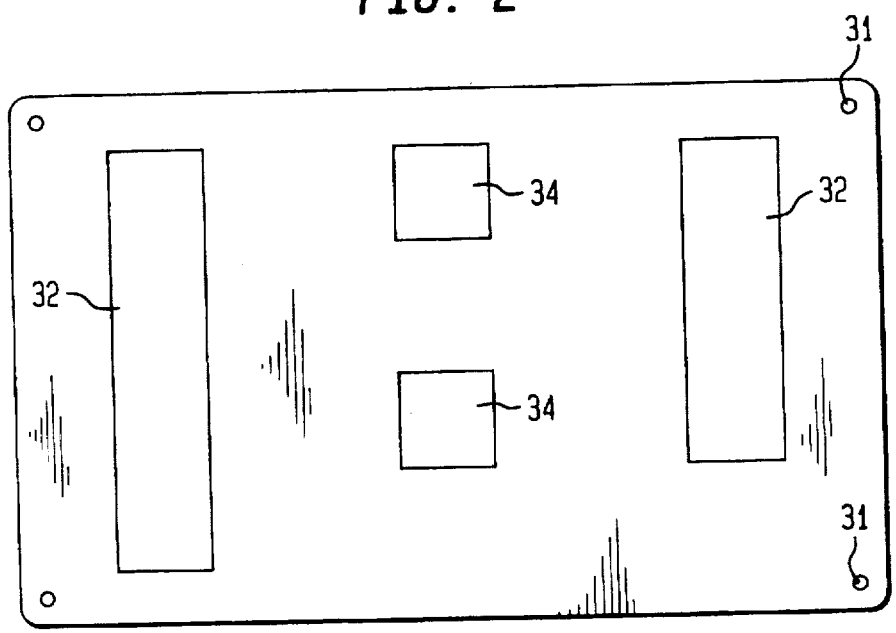
FIG. 2 is a top view of a pallet which has been machined such that it does not contact the circuit board in the machined regions.

As shown in FIG. 1, in one embodiment, an RF circuit board 10 has a Teflon/glass substrate 11, such as Arlon DiClad 880, available through ARLON's Materials for Electronics Division, Rancho Cucamonga, Calif. This substrate has a dielectric of 2.7 which lends itself to RF applications where signals not only follow circuitry but also emanate through the board and pallet. To assist in the creation of uniform adhesion in the bond between the circuit board 10 and the pallet 30, the substrate is flat. In the preferred embodiment, the substrate sheet 11 has a flatness of 0.050 inch/inch.

Figure 3:
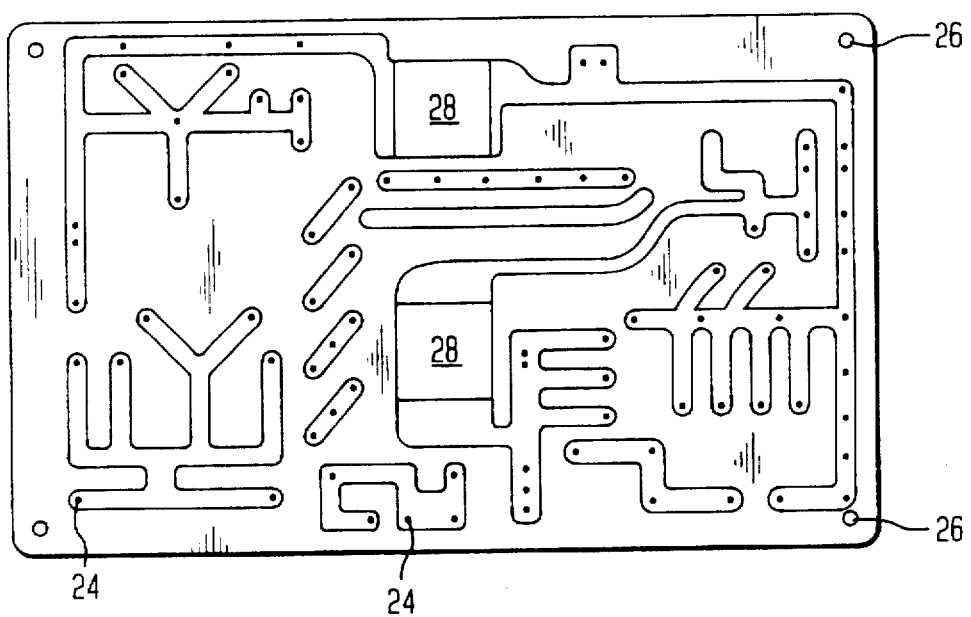
FIG. 3 is a bottom view of an RF circuit board which would mate with the pallet of FIG. 2, indicating areas which are not to be bonded to the pallet.

Electric conductor circuit paths 20, as shown in FIGS. 1&3, are created on the circuit board substrate 11. Summarizing a technique known in the art, the substrate 11 is clad with copper 20 and the clean and dry board is silk screened with resist to identify the conductor paths to be formed. The board is subjected to an etchant such as ferric chloride to dissolve away the unwanted copper 20 not coated with resist to form the conductor paths. In certain applications, the copper paths 20 are coated with other conductive metals, such as solder, tin or gold 22. This additional metal coating 22 over the copper paths 20 is conventionally applied by silk screening a mask over areas not to be coated, then applying the tin, solder or gold as a paste which is melted in place. Alternatively, the additional conductive metal 22 can be electroplated or applied by a metal bath against the copper circuit path 22. As is known in the art, the additional conductive metal 22 can be limited in application to a desired portion of the copper circuit path 20 by masking those areas where the metal 22 is not to be applied.

As shown in FIG. 3, the prepared circuit board 13 is cut and drilled to create vias 24 to permit population with electronic components and positioning against the pallet 30.

With RF amplifiers, certain components, notably power transistors, are placed in contact with the pallet 30 which functions as a heat sink for the components. To accommodate this, the circuit board is drilled and the hole 28 milled to the proper configuration as is shown in FIG. 3 to accommodate insertion of the power transistors through the board 10 to contact the pallet 30 in wells 34.

In the preferred embodiment, the circuit board 13 is drilled to create datum holes 26. The location of each datum hole 26 is accurately controlled by fixturing (not shown) to locate each hole on the circuit board so that it can be aligned with mating holes in the pallet 30 and permit insertion about and capture of the alignment pins 52 when the circuit board is placed in the bonding fixture 50 as shown in FIGS. 4–7.

As shown in FIG. 3, in the preferred embodiment, the underside of the circuit board on which the circuit paths 20 have been etched is cleaned, a coating of tin 22 is selectively applied over the copper electric conductor circuit paths 20 and a solder mask (not shown) is applied to those areas which are not to be soldered to the pallet 30.

In the preferred embodiment, the pallet 30 is aluminum, formed to the desired configuration through any of a number of operations such as extrusion, die forming and machining. Copper and other materials may also be used to produce pallets. Before pallet 30 is coated, it is machined, for example by a milling operation (not shown), to create recessed zones and areas 32 which are not to contact the circuit board, and to create wells 34 for location of power transistors. Thus, zones 32 are created for RF transmissions through the pallet and wells 34 are created for heat absorption by the pallet without electrical connection. In the preferred embodiment, the pallet 30 is drilled to create datum holes 31. The location of each datum hole 31 is accurately controlled by fixturing (not shown) to locate each hole on the pallet so that it can be aligned with mating holes in the circuit board 10 and permit insertion about and capture of the alignment pins 52 when the pallet 30 is placed in the bonding fixture 50 as shown in FIGS. 4–7.

In the innovative approach of the instant invention, rather than using a solder buttering technique to apply solder to the pallet, in the preferred embodiment, the pallet 30 is electroplated to achieve a uniform coating of metal plating 36.

Alternatively, other methods which assure a uniform coating, such as dipping, could be used. In the preferred embodiment, the metal plating 36 is 40% tin/60% lead solder. The solder plating 36 is created in the electroplating process by use of a 40% tin/60% lead solder annode, or a suitable number of pure tin and pure lead anodes to produce the desired ratio, and a fluoboric acid or sulfonic acid bath based 40%/60% tin/lead, or other suitable alloy, the alloy plating bath containing various chemical grain refiners and additives. One such bath is the FluoFree®MR tin/lead plating bath available from MacDermid, Inc., Waterbury, Conn. with appropriate adjustments to obtain the desired alloy, e.g. 40/60 tin/lead.

The electroplating technique entails cleaning and washing the aluminum pallet 30 in preparation for electroplating; submersing the pallet 30 in an electroplating tank containing the appropriate electroplating solution along with the appropriate metal anode(s); and applying an electric current between the cathode and anode(s). In the preferred embodiment, the resulting plating finish produced on the pallet 30 is a fine grained, matte, uniform deposit, although bonding is possible using a bright or dull plating finish. Plating thickness is controlled by controlling the amount of electric current which is applied and the length of time current is applied in the electroplating process. While plating is discussed as applied to the entire surface, it is to be understood that plating can be limited to areas of interest on the pallet surface. Thus, if desired, plating can be limited to just the pallet surface which is to contact the circuit board circuit paths.

In the preferred embodiment, the solder plating 36 has a thickness of 0.0003 inches or greater. Plating thickness is dependent upon the surface finish of the pallet 30 because, in the electroplating process, plating deposits tend to build up more quickly on the peaks than in the valleys of surface scratches while, in the alloying process, the plated metal tends to flow off the peaks into the valleys of surface scratches. So that alloying is uniform across the pallet surface, the minimum plating thickness of the solder plating 36 must be sufficient for plating deposits to remain on the peaks after flowing into the valleys during the soldering operation. In instances in which the surface finish of the pallet is very smooth, for example, where the pallet is formed by stamping, it is possible to reduce plating thickness more, although 0.0002 inches seems to be a prudent lower limit even in such instances.

In the novel approach of the instant invention, differences in melting points for pure tin, pure lead, and solder alloys in creating metal bonds in successive solder-type bonding operations create a superior technique and result for circuit board assembly.

In conventional circuit board bonding, a 60% tin/40% lead solder is used for all bonding operations, including not only the initial bonding of the circuit board to the pallet but also the subsequent bonding of components on the circuit board/pallet assembly. The instant invention uses alloys or pure metals in circuit board/pallet bonding which have relatively higher melting points than the alloys or metals used in subsequent assembly operations to avoid compromising the bond between the circuit board and the pallet. Pure tin, lead or any tin/lead alloy which has a melting point higher than that of 60/40 solder as the bond material between the circuit board and the pallet will not melt at the working temperatures of 60/40 solder used in subsequent assembly operations. Because 60/40 solder has a melting point of approximately 187.8 degrees Centigrade (C.), 370 degrees Fahrenheit (F.), while pure tin has a melting point of 232.8 degrees C., 451 degrees F. and any solder alloy having a tin component of 40% or less has a melting point of 237.8 degrees C., 460 degrees F., or higher, use of pure tin and/or 40/60 solder in bonding the circuit board 10 to the pallet 30 provides a temperature buffer of forty-four degrees C. between the working temperature of the 60/40 solder and the lowest temperature at which bond integrity between the circuit board and the pallet becomes a concern.

In the preferred embodiment of the instant invention, 40/60 solder is used as pallet plating 36 and pure tin is the metal plating 22 over circuit paths 20, which in combination are the alloying/bonding agents between the circuit board and the pallet. 60/40 solder is used in subsequent component assembly operations on the bonded circuit board/pallet assembly, although solders having a higher tin content can also be used.

While the several Figures show the pallet 30 and the circuit board 13 as the same size, this is not necessary to the practice of the invention. The pallet 30 can be larger than the circuit board 13 and vice versa, provided that the mounting area on the pallet 30 is plated and that it is of a size sufficient to satisfy the heat dissipation needs of the components and paths associated with the circuit board 10 to which the pallet 30 is joined. Likewise, the bonding fixture 50 is reconfigured to accommodate the disparate sized components.

Returning to the process of bonding the circuit board 10 to the pallet 30, the plated and machined pallet 30 is cleaned and flux applied (not shown). Flux can be applied to either the pallet 30 or the circuit board circuit paths 20, but in the preferred method, flux is applied to the pallet 30 since it remains upright throughout subsequent operations.

The instant invention has found that bond adhesion is significantly improved by holding the pallet 30 and the circuit board 10 in close proximity to one another during bonding and has further found that alignment between the circuit board and the pallet, often critical to proper operation of the completed circuit board assembly, is improved by mechanically maintaining the position of the components during bonding. These findings are implemented through an innovative bonding fixture hereafter described. Alignment fixture 50 in its preferred embodiment is comprised of a body 54 having a flat base surface 62, and a mounting channel 63 which extends the length of the opposite face defined by two end walls 56 each having a bracket 58 which forms an inverted ledge 60 at the distal ends of which are alignment pins 52. As illustrated by the exploded view of FIG. 5, and the cut-away shown in FIG. 7 taken along line 4—4 of FIG. 4, a plurality of drilled spring cavities 64 extend into body 54 in operative interaction with with a drilled pressure pin bore 66 having the same centerline as the spring cavity. A pressure pin 68 having a cylindrical shaft 70 and a cylindrical, saucer-shaped head 71 is disposed in sliding relation within the bore 66 and spring cavity 64, respectively. The pin shaft 70 has a relatively flat or blunt tip 74.

Figure 6:
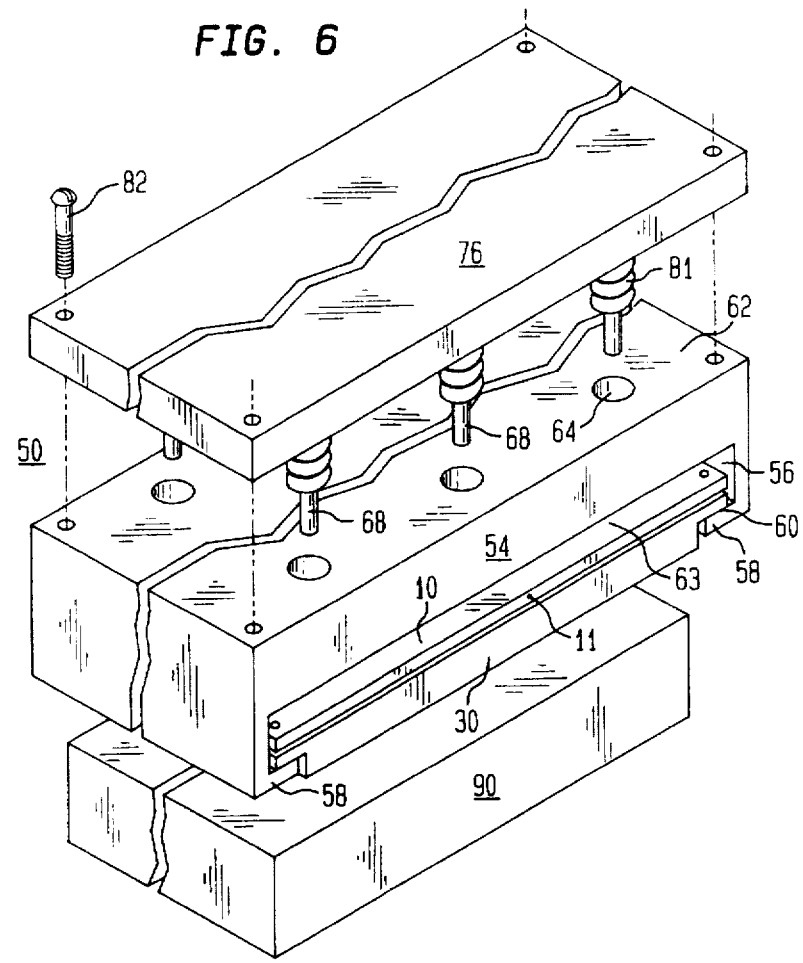
FIG. 6 is an exploded perspective of the alignment fixture of the perferred embodiment shown in FIG. 4 showing the pallet and circuit board inserted onto the alignment pins of the alignment fixture.
Figure 7:
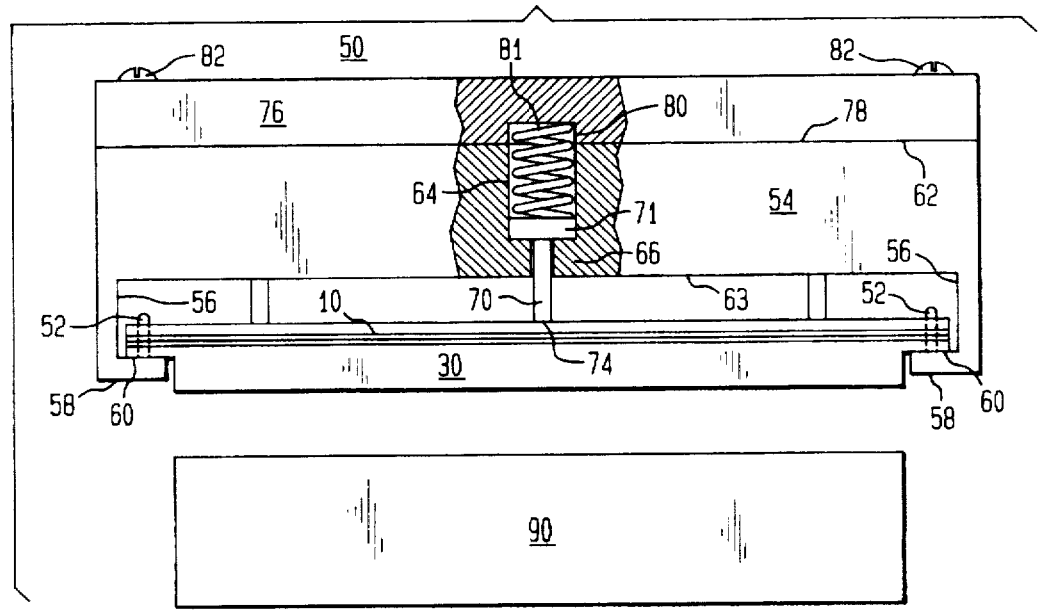
FIG. 7 is a cross section taken along 4—4 in FIG. 4 showing the spring-loaded studs in the extended position controlled by tightening the base plate against the frame.

A base plate 76 has a mounting face 78 which conforms in topography to the body base surface and has a plurality of drilled spring cavities 80, one such spring cavity being shown in the cutaway of FIG. 7 taken along lines 4—4. of FIG. 1. Also residing in each spring cavity 80 and extending into each spring cavity 64 in body 54 is a spring 81 in operative sliding relation with the pin head 70 captured within the body spring cavity 80. While FIGS. 4–7 illustrate the spring cavities and pressure pins as distributed about the alignment fixture in a symmetrical pattern, this illustration has assumed that the primary adhesion points of interest for the circuit paths 20 also are distributed in a similar pattern so that pressure, while fairly uniformly applied across the circuit board surface is also localized at or near the areas where bonding is to occur between the circuit board circuit paths 20 and the pallet plating 36.

As shown in FIG. 6, base plate 76 is removeably attached to body 54 by a plurality of threaded screws 82. By screwing home the threaded screws 81 into body 54, base plate 76 is moved in closer proximity to body base surface 62 causing the captured springs 81 in each spring cavity 80&81 to press against the pin head 70 forcing the pin shaft 72 to translate along bore 64 to penetrate and stand proud of the surface of the mounting channel 63 when the base plate is tightened home against the body. In the fully tightened assembly of the fixture components, the pins will exert, in the aggregate, approximately 200 pounds pressure per square inch against the surface of a circuit board captured within the fixture.

As shown in FIGS. 4–7, insertion of the components into the alignment fixture is accomplished by first relieving pressure on the pressure pins 68 by backing off the screws 82 threaded into the body 54 allowing the base plate 76 to move away from the body, releasing pressure on the springs 81 and permitting the pressure pins 68 to translate a distance into the spring cavity 64 sufficient for the circuit board 10 and the pallet 30 to be inserted between the endwalls 56 and onto the alignment pins 52 without interference. The pallet 30 and circuit board 10 are assembled with the surfaces to be bonded against one another, with the pallet 30 the outermost of the two, then placed against the opposing alignment pin ledges 60 with alignment pins 52 penetrating the respective datum holes 31 to align the circuit board 10 with the pallet 30 in the mounting channel 63. With the circuit board 10 and pallet 30 so positioned, the screws 82 are tightened to draw the base plate 76 against the fixture body 54 causing the springs to force the pressure pins 68 toward the base of the spring cavities 64. With this translation of the pressure pins 68, the pin shaft tips 74 contact and press against the upper surface of the circuit board 10 causing the circuit board to mechanically contact and remain in close proximity to the pallet 30.

Figure 4:
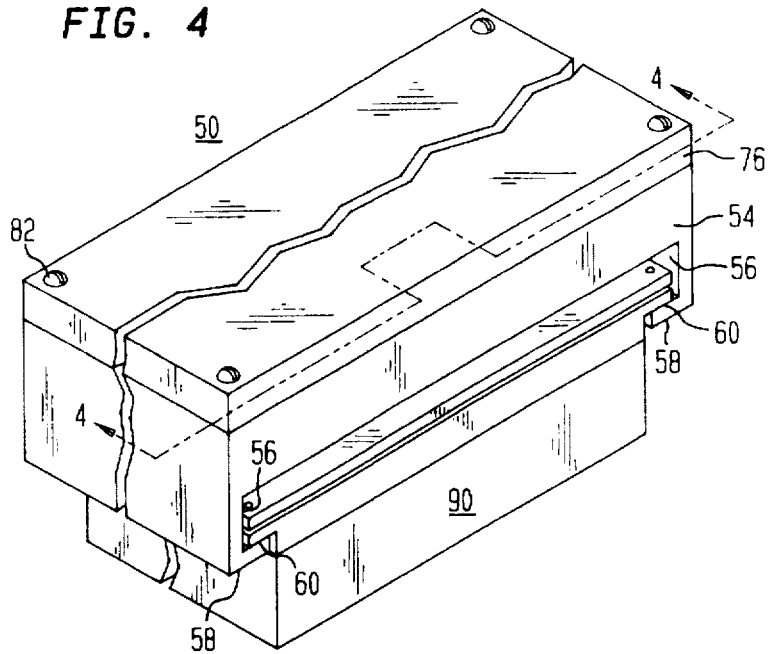
FIG. 4 is a front perspective of the bonding fixture of the preferred embodiment in which a pallet and circuit board are mounted for tin bonding, showing also the nitrogen bath introduction and hot plate.
Figure 5:
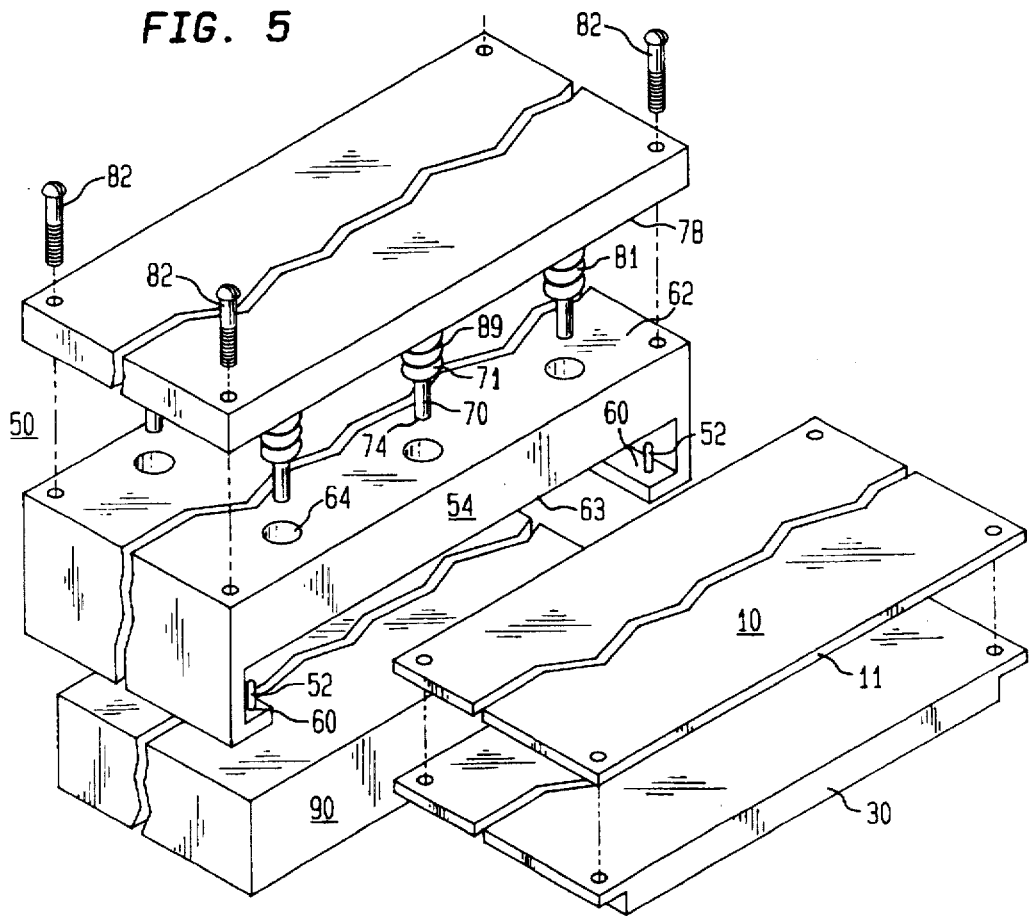
FIG. 5 is an exploded perspective of the alignment fixture of the preferred embodiment shown in FIG. 4 showing the pallet and circuit board prior to insertion and the drilled spring cavities in the body base.

With the pallet 30 and circuit board so assembled in the alignment fixture, the pallet is placed on a hot plate 90, as shown in FIG. 4, heated to a temperature sufficient for melting and alloying to occur between the pallet plating 36 and the metal 22 on the portions of the circuit paths which are not masked. In the case of the preferred embodiment which utilizes 40/60 solder as the pallet plating 36 and tin as the metal 22, the operating temperature of the hot plate will be at least 460 degrees F. As the pallet 30 is heated, in the preferred embodiment, a nitrogen gas bath (not shown) is introduced into the mounting channel 63 to retard oxidation during the soldering process. Additionally, the vias 24 in the board 13 prevent gas build-up at the interface of the pallet 30 and the circuit board 13. Once the pallet is raised within the proper temperature range, the tin 22 and solder 36 change state and begin to flow at which time the flux (not shown) conditions the circuit paths 20 coated with tin 22 which facilitates the occurrence of alloying and bonding to occur between the solder 36 and the circuit paths 20 coated with tin 22. This occurs between 260–300 degrees Centigrade in the preferred embodiment. The temperature is held in the stated range for approximately 30 seconds to permit proper tin and solder melt and alloying. Once the pallet 30 is sufficiently heated to cause melting and alloying of the pallet plating 36 with the metal layer 22 over the circuit paths, the alignment fixture with the captured components are removed from the hot plate and allowed to cool. In the preferred embodiment, cooling is promoted by blowing chilled air (not shown) over the assembly.

Upon removal of the now bonded circuit board and pallet assembly from the alignment fixture, the assembly is populated with components, with power transisters being located in the heat sink wells 34 of the pallet 30 and other components in their appropriate positions in the vias 24 on the circuit board. The components are soldered in position using, in the preferred embodiment, 60/40 solder. By controlling the heat within a reasonable range of that required to melt the 60/40 solder, the integrity and uniform adhesion between the circuit board and the pallet remains unaffected.

The integrity of the bonding technique is reflected in the efficiency of the completed RF amplifier unit. The efficiency of RF amplifiers is measured as the ratio of power in to power out of the circuit in watts. Using prior art connection techniques, including adhesive connection, mechanical connection and solder bonding, the average efficiency of a typical RF amplifier unit ranged between 42% and 44%. With the bonding technique of the instant invention, the average efficiency for the same amplifier rose to 49%, indicating a significant improvement which must be attributed to the superior bond between the circuitry and the heat sink without degradation of the unbonded zones critical to RF capability.

It will be understood that the above description of the present invention is susceptible to various modifications, changes and adaptations, and the same are intended to be comprehended within the meaning and range of equivalents of the appended claims.

What is claimed is:

1. A method of mounting a circuit board to a pallet, to which one or more electrical components will be connected by melting an alloying metal therebetween, said method to form a circuit board assembly which produces a superior electrical and mechanical connection between the circuit board and the pallet, wherein the circuit board is comprised of an electrically non-conductive substrate and at least one metal circuit path on one face of the substrate, which comprises the steps of:
   (a) electroplating the pallet with a bonding metal plating, said bonding metal plating having a higher melting point than the said alloying metal;
   (b) positioning the circuit board with the at least one metal circuit path against the pallet; and
   (c) pressing the circuit board against the pallet and holding the at least one metal circuit path in contact with the pallet bonding metal plating while heating the pallet until the bonding metal plating melts and alloys with the at least one circuit path and while allowing the circuit board assembly to cool until the bonding metal plating solidifies.

2. A method as defined in claim 1 including the additional steps of:
   (a) applying flux between at least a portion of the bonding metal plating and at least a portion of the at least one metal circuit path to facilitate thereat the alloying of the bonding metal plating with the at least one metal circuit path; and
   (b) while heating the pallet and alloying the bonding metal plating to the circuit path, immersing the circuit board and pallet in a nitrogen gas bath to prevent oxidation.

3. A method as defined in claim 1 which is applied to a metallic circuit path comprised of copper, a substrate of teflon glass, and a pallet of aluminum, and wherein the bonding metal plating is selected from the group of tin or tin/lead solders consitituted of forty percent or less tin.

4. A method of creating a circuit board unit by bonding a circuit board, having a substrate, a top face and a bottom face, and at least one metal circuit path formed on the substrate bottom faces to a pallet having a mounting surface, said circuit board to have one or more electrical components connected thereto subsequently by melting an alloying metal between said circuit path and said one or more components, said method comprising the steps of:
   (a) electroplating the pallet mounting surface with a bonding metal plating having a higher melting point than the melting point of the said alloying metal;
   (b) positioning the circuit board with the bottom face against the pallet mounting surface such that the at least one metal circuit path contacts the pallet mounting surface bonding metal plating;

(c) applying pressure to the circuit board top face to hold the at least one metal circuit path in constant close contact with the bonding metal plating on the pallet mounting surface;

(d) heating the pallet to a temperature sufficient to cause the bonding metal plating on the pallet mounting surface to alloy with the circuit path; and (e) allowing the pallet to cool causing the bonding metal plating to solidify, the alloyed portion bonding with the at least one circuit path of the circuit board.

5. The method of claim 4 wherein:

(a) constructing the pallet mounting surface and the circuit board substrate bottom face with matching flat faces;

(b) the pallet mounting surface bonding metal plating is electroplated to a thickness of approximately 0.0003 inches or greater;

(c) heating of the pallet is to a temperature between 250–300 degrees Centigrade;

(d) pressure applied through the circuit board against the pallet is approximately 200 pounds per square inch;

(d) the at least one metal circuit path is copper overlaid with a metal selected from the group of tin, gold and tin/lead solder;

(e) the circuit board is teflon glass; and (f) the pallet is aluminum.

6. The method of claim 4, including the additional steps of:

(a) drilling vias through the circuit board;

(b) applying flux to the plated pallet mounting surface before positioning the circuit board thereagainst;

(c) immersing the pallet and the circuit board in a nitrogen bath during heating and alloying of the bonding metal plating.

7. A method of connecting a metal pallet to metal circuit paths resident on an electrically non-conductive substrate of a circuit board to yield a superior mechanical and electrical connection, comprising the steps of:

(a) coating the pallet with a first bonding metal layer of uniform thickness;

(b) applying flux to either the pallet first bonding metal layer or the metal circuit paths;

(c) heating the pallet first bonding metal layer until the first bonding metal layer melts and alloys with the metal circuit paths;

(d) cooling the first bonding metal layer below its melting point;

(e) during steps (c) and (d) above, holding the metal circuit paths in close contact with the pallet first bonding metal layer;

(f) populating the circuit board with electrical components using a second bonding metal selected from the group made up of tin/lead solders; and (g) selecting the first bonding metal layer from a group made up of tin and tin/lead solders having a melting point higher than the second bonding metal.

8. The method of claim 7 comprising the further step of constructing the circuit paths of copper overlaid by a metal selected from the group of tin, gold, and solder.

* * * * *